United States Patent
Schier et al.

(10) Patent No.: US 9,249,515 B2
(45) Date of Patent: Feb. 2, 2016

(54) TOOL WITH CHROMIUM-CONTAINING FUNCTIONAL LAYER

(75) Inventors: Veit Schier, Leinfelden-Echterdingen (DE); Wolfgang Engelhart, Metzingen (DE)

(73) Assignee: Walter AG, Tübingen (DE)

( * ) Notice: Subject to any disclaimer, the term of this patent is extended or adjusted under 35 U.S.C. 154(b) by 14 days.

(21) Appl. No.: 14/238,352

(22) PCT Filed: Sep. 5, 2012

(86) PCT No.: PCT/EP2012/067328
§ 371 (c)(1),
(2), (4) Date: Mar. 19, 2014

(87) PCT Pub. No.: WO2013/034598
PCT Pub. Date: Mar. 14, 2013

(65) Prior Publication Data
US 2014/0193637 A1    Jul. 10, 2014

(30) Foreign Application Priority Data
Sep. 7, 2011  (DE) .......................... 10 2011 053 372

(51) Int. Cl.
C23C 14/32  (2006.01)
C23C 30/00  (2006.01)
(Continued)

(52) U.S. Cl.
CPC ................ C23C 30/00 (2013.01); C23C 14/06 (2013.01); C23C 14/0641 (2013.01);
(Continued)

(58) Field of Classification Search
USPC ............ 51/307, 309; 428/216, 336, 697, 698, 428/699, 701, 702
See application file for complete search history.

(56) References Cited

U.S. PATENT DOCUMENTS 5,447,804 A *  9/1995  Schulz et al. ................. 428/472
6,210,726 B1   4/2001  Schiller et al.
(Continued)

FOREIGN PATENT DOCUMENTS

AU   2007-306494   4/2008
CA   2 665 044     4/2008
(Continued)

OTHER PUBLICATIONS

English Translation for First Office Action for Chinese Application No. 201280036719, dated Mar. 11, 2015.
(Continued)

Primary Examiner — Archene Turner
(74) Attorney, Agent, or Firm — Morgan, Lewis & Bockius LLP

(57) ABSTRACT

Cutting tool has a substrate and a multilayer coating deposited by PVD. The coating comprises a base layer of one or more identical or different layers of a nitride or carbonitride which contains at least aluminium (Al) and a chromium-containing, oxidic functional layer. Attachment of the chromium-containing functional layer is improved by an intermediate layer of one or more oxides or oxide nitrates of the metals Al, Cr, Si, and/or Zr provided between the base layer and the functional layer. The intermediate layer has a cubic structure and the chromium-containing functional layer is selected from chromium oxide ($Cr_2O_3$), chromium oxynitride, aluminium-chromium oxide ($AlCr)_2O_3$, aluminium-chromium oxynitride or a mixed oxide or mixed oxynitride of aluminium, chromium and further metals of ($AlCrMe_1$, $Me_n)_2$ oxide or ($AlCrMe_1$, $Me_n)_2$ oxynitride, where Me ... $Me_n$ means one or more further metals, selected from Hf, Y, Zr and Ru, and wherein the functional layer has a rhombohedral structure.

20 Claims, 2 Drawing Sheets

(51) Int. Cl.
  *C23C 14/06* (2006.01)
  *C23C 14/08* (2006.01)
  *C23C 14/35* (2006.01)

(52) U.S. Cl.
  CPC .............. *C23C 14/08* (2013.01); *C23C 14/081* (2013.01); *C23C 14/32* (2013.01); *C23C 14/325* (2013.01); *C23C 14/35* (2013.01); *C23C 14/354* (2013.01); *C23C 30/005* (2013.01); *Y10T 428/265* (2015.01)

(56) References Cited

U.S. PATENT DOCUMENTS

| | | | |
|---|---|---|---|
| 6,423,403 B2 | 7/2002 | Schiller et al. | |
| 6,673,430 B2 | 1/2004 | Schiller et al. | |
| 6,767,627 B2 * | 7/2004 | Morikawa et al. | 428/336 |
| 7,674,250 B2 * | 3/2010 | Freyman et al. | 604/522 |
| 7,674,520 B2 | 3/2010 | Schier | |
| 7,939,181 B2 * | 5/2011 | Ramm et al. | 428/701 |
| 7,993,445 B2 * | 8/2011 | Roesch et al. | 51/309 |
| 8,025,989 B2 * | 9/2011 | Larsson | 51/307 |
| 8,025,991 B2 * | 9/2011 | Schier | 428/698 |
| 8,129,040 B2 * | 3/2012 | Quinto et al. | 428/702 |
| 8,173,278 B2 * | 5/2012 | Cremer | 428/699 |
| 8,409,732 B2 * | 4/2013 | Johansson et al. | 428/697 |
| 8,491,996 B2 * | 7/2013 | Schier | 428/336 |
| 8,603,617 B2 * | 12/2013 | Schier et al. | 428/216 |
| 2004/0121147 A1 | 6/2004 | Morikawa et al. | |
| 2008/0090099 A1 | 4/2008 | Ramm et al. | |
| 2009/0252973 A1 | 10/2009 | Cremer | |
| 2010/0260560 A1 | 10/2010 | Schier | |
| 2011/0182681 A1 | 7/2011 | Schier et al. | |
| 2011/0183084 A1 | 7/2011 | Ramm et al. | |
| 2013/0209834 A1 | 8/2013 | Engelhart et al. | |

FOREIGN PATENT DOCUMENTS

| | | |
|---|---|---|
| CN | 1278307 | 12/2000 |
| CN | 1927513 | 3/2007 |
| CN | 101522950 | 9/2009 |
| DE | 10 2004 044 240 | 3/2006 |
| DE | 10 2007 030 734 | 1/2007 |
| DE | 10 2008 026 358 | 12/2009 |
| DE | 10 2010 028 558 | 11/2011 |
| EP | 1 253 215 | 10/2002 |
| JP | 2002-053946 * | 2/2002 |
| WO | 2008/043606 | 4/2008 |
| WO | 2008/138789 | 11/2008 |
| WO | WO 2009/003756 | 1/2009 |
| WO | 2009/110831 | 9/2009 |
| WO | 2011/020740 | 2/2011 |

OTHER PUBLICATIONS

Translation of the International Preliminary Report on Patentability in PCT/EP2012/067328 dated Mar. 12, 2014.
German Search Report in Application No. 10 2011 053 372.9 dated Mar. 19, 2012.
International Search Report and Written Opinion in PCT/EP2012/067328 dated Jan. 23, 2013.

\* cited by examiner

TOOL WITH CHROMIUM-CONTAINING FUNCTIONAL LAYER

SUBJECT OF THE INVENTION

The present invention relates to a cutting tool with a substrate of hard metal carbide, cermet, steel or high-speed steel (HSS) and a multi-layer coating deposited thereon by the PVD process and which comprises a base layer of one or more identical or different layers arranged one on top of the other consisting of a nitride or carbonitride which contains at least aluminium (Al) and optionally one or more further metals, selected from Al, Cr, Si, Y, Ru and Mo, and comprises a chromium-containing oxidic functional layer.

BACKGROUND OF THE INVENTION

Cutting tools which are used for example for metal-removing metal-machining as a rule consist of a base (substrate) of hard metal carbide, cermet, steel or high-speed steel with a wear-resistant single-layer or multi-layer coating of hard metallic substances, oxide layers and the like. Such coatings are applied using CVD (chemical vapour deposition) processes and/or PVD (physical vapour deposition) processes.

From EP 1 253 215 it is known for a multi-layer coating with a base layer of TiAlN and a functional layer of aluminium oxide or aluminium-chromium oxide to be deposited on a hard metal carbide substrate using the PVD process. Here, aluminium oxide is deposited with the single magnetron process during which gamma aluminium oxide is produced predominantly. Aluminium-chromium oxide is deposited using the arc PVD process, producing stable alpha aluminium-chromium oxide, but this has poor bonding to the underlying TiAlN base layer, and depending on the process large numbers of macro particles, so-called droplets, are formed which severely impair the quality of the functional layer.

DE 10 2010 028 558 describes a hybrid PVD process for depositing aluminium-chromium oxide mixed crystal layers in which the cathode atomisation and arc evaporation PVD processes are used simultaneously. Aluminium-chromium oxide mixed crystal layers are obtained predominantly in the stable alpha phase, which are essentially free of macro particles (droplets).

According to the known processes representing the state of the art, it is possible to produce aluminium oxide, aluminium-chromium mixed oxide or mixed oxides with further alloying elements in the stable alpha modification. However, these layers are characterised by poor bonding to the underlying substrate, for example a nitridic base layer, such as a TiAlN layer. The provision of such a base layer is desirable because oxide layers deposited directly onto the surface of the substrate are frequently too brittle to function as a wear prevention layer.

OBJECT OF THE INVENTION

The object of the present invention was therefore to improve the bonding of a chromium-containing functional layer on a base layer of hard substances containing nitride or carbonitride on a cutting tool consisting of a substrate with a multi-layer coating.

DESCRIPTION OF THE DRAWING FIGURES

DESCRIPTION OF THE INVENTION

Figure 1:
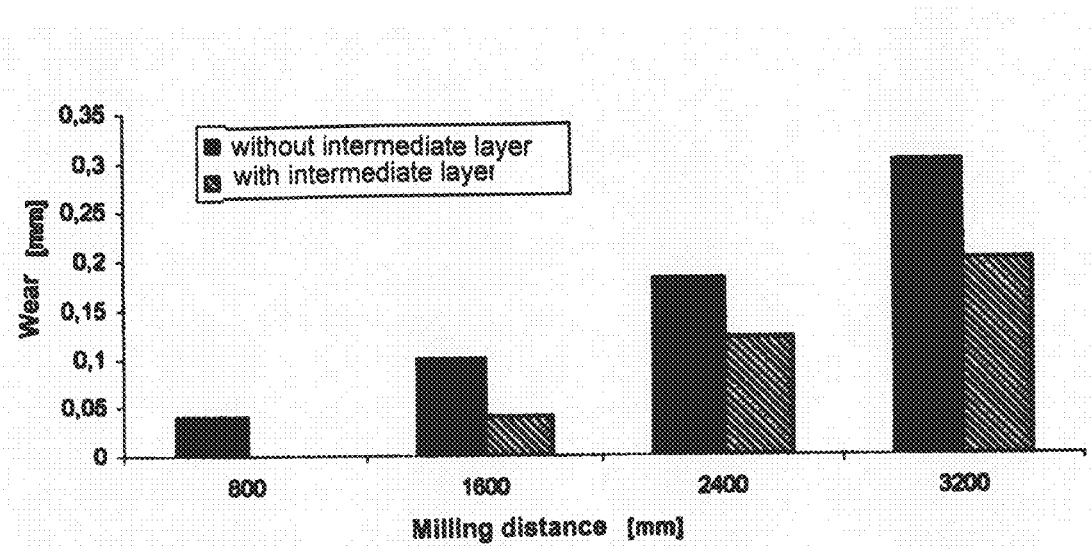
FIG. 1 shows wear [mm] against different milling distances [mm] without the intermediate layer and with the intermediate layer.

According to the invention, this object is achieved by a cutting tool with a substrate of hard metal carbide, cermet, steel or high-speed steel (HSS) and a multi-layer coating deposited thereon using the PVD process and which starting from the substrate comprises the following sequence of layers:

a) a base layer consisting of one or more identical or different layers arranged one on top of another of a nitride or carbonitride and which contains at least aluminium (Al) and optionally one or more further metals selected from Ti, Cr, Si, Y, Ru and Mo, b) an intermediate layer arranged on top of the base layer and consisting of one or more oxides or oxynitrides of the metals Al, Cr, Si, and/or Zr, the intermediate layer exhibiting a cubic structure, c) a chromium-containing functional layer arranged on top of the intermediate layer and selected from chromium oxide ($Cr_2O_3$), chromium oxynitride, aluminium-chromium oxide $(AlCr)_2O_3$, aluminium-chromium oxynitride or a mixed oxide or mixed oxynitride of aluminium, chromium and further metals $(AlCrMe_1, \ldots Me_n)_2$ oxide or $(AlCrMe_1, \ldots Me_n)_2$oxynitride, in which $Me_1, \ldots Me_n$ means one or more further metals, selected from Hf, Y, Zr and Ru, the functional layer exhibiting a rhombohedral structure. n is an integer corresponding to the number of further metals present in the mixed oxide or mixed oxynitride apart from aluminium and chromium.

In one preferred form of embodiment of the present invention, in the coating of the cutting tool the base layer consists of titanium-aluminium nitride (TiAlN) or titanium-aluminium-silicon nitride (TiAlSiN), particularly preferably of titanium-aluminium nitride (TiAlN). Titanium-aluminium nitride (TiAlN) is very suitable as a base layer since it is very tough and hard and has excellent wearing properties, particularly at high temperatures which occur during metal machining.

It has been shown that the provision of the intermediate layer according to the invention on top of the base layer according to the invention which preferably consists of TiAlN, greatly improves the bonding and adhesion of the chromium-containing functional layer arranged on top of it. In machining tests using cutting tools consisting of a hard metal carbide substrate, a base layer according to the invention, an intermediate layer according to the invention consisting of a cubic oxide or oxynitride, preferably of cubic gamma aluminium oxide, and a functional layer according to the invention with a rhombohedral structure, for example a layer of aluminium-chromium oxide, greatly reduced tool wear was obtained with the coating according to the invention with the intermediate layer in comparison with a corresponding cutting tool without the intermediate layer.

According to the invention, the chromium-containing functional layer exhibits a rhombohedral crystal structure. The functional layer can be pure chromium oxide ($Cr_2O_3$), chromium oxynitride, aluminium-chromium oxide $(AlCr)_2O_3$, aluminium-chromium oxynitride or an aluminium-chromium mixed oxide or mixed oxynitride with further metals, selected from Hf, Y, Zr and Ru. Particularly preferably the chromium-containing functional layer consists completely or at least to the extent of 90 vol. % of aluminium-chromium oxide with a rhombohedral crystal structure, i.e. of aluminium-chromium oxide in the alpha modification. When speaking here of aluminium-chromium oxide $(AlCr)_2O_3$, this does not necessarily mean that the elements aluminium and chromium are present in the same stoichiometric proportions. The proportion of chromium can be higher or lower than the proportion of aluminium in the aluminium-chromium oxide layer.

In one preferred form of embodiment of the present invention, the proportion of chromium among the metallic elements of the functional layer is at least 70 at. % Cr. In a further form of embodiment the proportion of chromium is at least 85 at. % Cr or at least 95 at. % Cr. A high proportion of chromium in the functional layer has the advantage that it promotes the growth of the functional layer in the desired rhombohedral structure.

The intermediate layer according to the invention, which is arranged directly on top of the base layer, consists of oxides or oxynitrides of the metals Al, Cr, Si and/or Zr and exhibits a cubic structure. In one preferred form of embodiment of the present invention, the intermediate layer consists of cubic gamma aluminium oxide ($\gamma$-$Al_2O_3$).

The improvement in the adhesion and bonding of the functional layer to the base layer through the provision of the intermediate layer according to the invention with a cubic structure was surprising. So far there is no proven explanation for why just such a cubic intermediate layer improves the adhesion and bonding of the functional layer on the base layer in such a manner. The inventors of the present application have carried out XPS (x-ray photoelectron spectroscopy) measurements on the layers according to the invention (base layer, intermediate layer and functional layer). The XPS measurements on the functional layer of a coating with an intermediate layer according to the invention revealed an increased metallic proportion of chromium on the surface of the functional layer facing the intermediate layer in comparison to a coating without the intermediate layer according to the invention. Without committing themselves to this theory, the inventors presume that the formation of a transitional zone with a higher proportion of metal bonds between the cubic intermediate layer and the rhombohedral functional layer could contribute to or cause the improved bonding of the functional layer.

The intermediate layer of the coating according to the invention can essentially be deposited using any suitable PVD process. However, magnetron sputtering, reactive magnetron sputtering, dual magnetron sputtering, high power impulse magnetron sputtering (HIPIMS) or the simultaneous application of cathode atomisation (sputter deposition) and arc evaporation (arc PVD), also called hybrid PVD processes, are preferred.

The functional layer can also be deposited using any suitable PVD process. Arc evaporation (arc PVD), magnetron sputtering, reactive magnetron sputtering, dual magnetron sputtering, high power impulse magnetron sputtering (HIPMS) or simultaneous application of cathode atomisation (sputter deposition) and arc evaporation (arc PVD), or hybrid PVD processes, are preferred.

In one preferred form of embodiment of the cutting tool according to the invention, the base layer has a coating thickness of from 50 nm to 8 µm, preferably of from 500 nm to 5 µm, particularly preferably of from 2 µm to 4 µm.

In a further form of embodiment of the cutting tool according to the invention, the intermediate layer has a coating thickness of from 1 nm to 2 µm, preferably of from 5 nm to 750 nm, particularly preferably of from 10 nm to 50 nm.

In a further preferred form of embodiment of the cutting tool according to the invention, the functional layer has a coating thickness of from 100 nm to 10 µm, preferably of from 500 nm to 5 µm, particularly preferably of from 750 nm to 2 µm.

In a further preferred form of embodiment of the cutting tool according to the invention, the functional layer exhibits pressure loadings at the surface of less than 2 GPa, preferably of less than 1 GPa. Surprisingly, it was found that with higher coating thicknesses for the functional layer the danger of delamination is tinier when the pressure loadings at the surface are below 2 GPa. A further improvement was observed with pressure loadings at the surface of less than 1 GPa.

In a further preferred form of embodiment of the cutting tool according to the invention, the intermediate layer contains 0.1 to 5 at. %, preferably 0.5 to 4 at. %, particularly preferably 1.0 to 3 at. % argon. The proportion of argon comes from the reactive gas from the PVD deposition and in a few cases has an advantageous effect on the bonding of the functional layer to the underlying intermediate layer.

The present invention will now be explained further with reference to embodiment examples and the associated figures.

1. Production of Cutting Tools With and Without the Intermediate Layer

A hard metal carbide substrate with a mean grain size of approximately 1 µm and a Co content of approximately 10 wt % was firstly covered with a TiAlN base layer with a thickness of 4.6 µm by arc evaporation (arc PVD) applying the following parameters:

Base Layer
 Target (arc PVD): TiAl (33 at. %/67 at. %) metal
 Target diameter [mm]: 63
 $U_{bias}$ [−V]: 40 (DC)
 $N_2$ partial pressure [Pa]: 3.2
 $I_{A/C\ PVD}$ [A]: 65

To produce cutting tools according to the invention, an intermediate layer of gamma aluminium oxide with a thickness of 14 nm was deposited on this by dual magnetron sputtering (DMS) with the following parameters:

Intermediate Layer
 Targets (DMS): 2×Al metal
 Target size [mm×mm] 160×820
 Power (DMS) [kW]: 20
 $U_{bias}$ [V]: 60 (unipolar pulsed, 70 Hz)
 Duration [min]: 6
 Ar partial pressure [Pa]: 0.5

Following this, a 1.5 µm thick rhombohedral alpha aluminium-chromium oxide coating was deposited on tools with the intermediate layer according to the invention (invention) and without an intermediate layer (comparison) by a hybrid PVD process simultaneously applying dual magnetron sputtering (DMS) and arc evaporation (arc PVD) with the following parameters:

Functional Layer
 Targets (DMS): 2×Al metal
 Target size [mm×mm]: 160×820
 Power (DMS) [kW]: 20
 Targets (Arc PVD): 8×Cr metal
 $I_{Arc\ PVD}$ [A]: 65
 $U_{bias}$ [−V]: 60 (unipolar pulsed, 70 Hz)
 Duration [min]: 6

2. Machining Tests

The cutting tools previously produced as described in 1 with and without the intermediate layer were used to mill a workpiece made of 42 CrMo4 with a cutting speed $v_c$=235 m/min and a feed rate of $f_z$=0.2 mm. The results are reproduced in the graph shown in FIG. 1 in which the wear [mm] is shown against different milling distances [mm]. The results show that the wear of the cutting tools produced with the intermediate layer is a lot less than that of cutting tools without the intermediate layer. With a milling distance of 800 mm, no wear at all was found on cutting tools according to the invention with the intermediate layer. With a milling distance of 1600 mm, the wear of the cutting tool without the intermediate layer was more than twice that of the cutting tool according to the invention with the intermediate layer according to the invention.

The significantly improved adhesion and bonding of the functional layer gives cutting tools with greatly reduced wear and consequently much longer tool life than until now. This means a saving of cutting tools, less frequent changing of cutting tools and thus less failure and machine downtime, higher productivity and lower costs.

Figure 2:
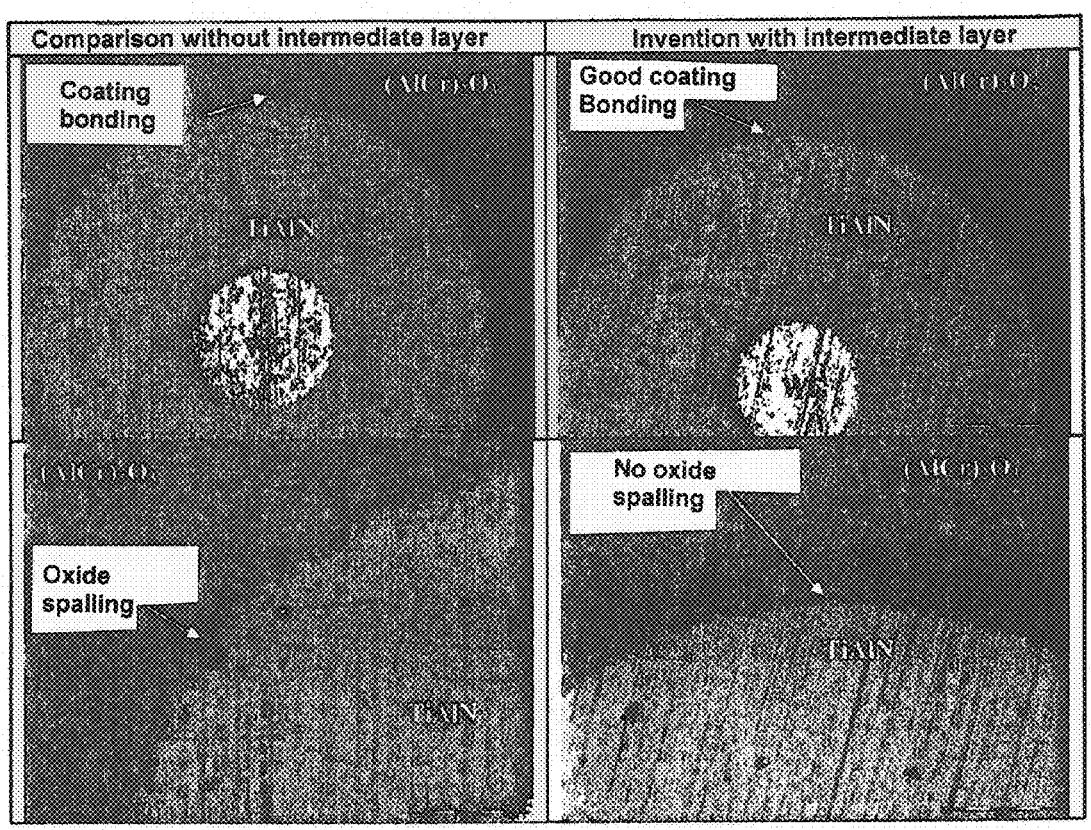
FIG. 2 shows light-optical microscope images of the ground cutting tools showing a comparative example without the intermediate layer (with poor coating bonding and oxide spalling) and an inventive sample with the intermediate layer (with good coating bonding and no oxide spalling).

3. Light-optical Microscopic Examination of the Cutting Tools With and Without the Intermediate Layer A calotte-shaped hollow was ground in the coating of the cutting tools produced as described in 1 with and without the intermediate layer according to the invention and then a ball was used to create a trough extending down to the hard metal carbide substrate in the middle. This allowed the hard metal carbide substrate, the TiAlN base layer and the aluminium-chromium oxide layer to be seen under the light-optical microscope. The few nanometers thick intermediate layer is not resolved under the light-optical microscope and therefore does not show as a discrete layer. The light-optical microscope images of the ground cutting tools are reproduced in FIG. 2.

On the cutting tool without the intermediate layer according to the invention, the junction between the TiAlN base layer and the aluminium-chromium oxide functional layer reveals a distinct dark frayed intermediate ring of so-called spalling which is indicative of poor bonding of the coating between the two layers. The adhesion between the two layers is good when the junction between the two layers shows a sharp edge. This is clearly visible in the case of the cutting tool according to the invention with the cubic intermediate layer according to the invention.

4. XPS (X-ray Photoelectron Spectroscopy) of the Functional Layer of Cutting Tools With and Without the Intermediate Layer According to the Invention XPS spectra of the functional layer on the side facing the substrate of the cutting tools produced as described in 1 with and without the intermediate layer show that the functional layer of the cutting tool with the intermediate layer according to the invention exhibits a higher metallic proportion of chromium at the interface than the cutting tool without the intermediate layer according to the invention. As already stated, the inventors suspect that the improved bonding of the functional layer is due to the formation of a transitional zone with a higher proportion of metallic bonds between the cubic intermediate layer and the rhombohedral functional layer.

The invention claimed is:

1. Cutting tool including a substrate of hard metal carbide, cermet, steel or high-speed steel (HSS) and a multi-layer coating deposited thereon by a PVD process, wherein starting from the substrate the multi-layer coating comprises the following sequence of layers:
   a) a base layer consisting of one or more identical or different layers arranged one on top of another of a nitride or carbonitride and which contains at least aluminium (Al) and optionally one or more further metals selected from Ti, Cr, Si, Y, Ru and Mo,
   b) an intermediate layer arranged on top of the base layer and consisting of one or more oxides or oxynitrides of the metals Al, Cr, Si, and/or Zr, the intermediate layer exhibiting a cubic structure and a coating thickness of from 1 nm to 750 nm, and
   c) a chromium-containing functional layer arranged on top of the intermediate layer and selected from chromium oxide ($Cr_2O_3$), chromium oxynitride, aluminium-chromium oxide $(AlCr)_2O_3$, aluminium-chromium oxynitride or a mixed oxide or mixed oxynitride of aluminium, chromium and further metals ($AlCrMe_1, \ldots Me_n)_2$ oxide or ($AlCrMe_1, \ldots Me_n)_2$ oxynitride, in which $Me_1...Me_n$ means one or more further metals selected from Hf, Y, Zr and Ru, the functional layer exhibiting a rhombohedral structure.

2. Cutting tool according to claim 1, wherein the intermediate layer consists of cubic aluminium oxide.

3. Cutting tool according to claim 1, wherein the chromium-containing functional layer consists at least to the extent of 90 vol. % of rhombohedral aluminium-chromium oxide $(AlCr)_2O_3$.

4. Cutting tool according to claim 1, wherein the proportion of chromium among metallic elements of the functional layer is at least 70 at. % Cr.

5. Cutting tool according to claim 1, wherein the intermediate layer is deposited by magnetron sputtering, reactive magnetron sputtering, dual magnetron sputtering, high power impulse magnetron sputtering or with simultaneous application of cathode atomisation and arc evaporation.

6. Cutting tool according to claim 1, wherein the functional layer is deposited by arc evaporation, magnetron sputtering, reactive magnetron sputtering, dual magnetron sputtering, high power impulse magnetron sputtering or with simultaneous application of cathode atomisation and arc evaporation.

7. Cutting tool according to claim 1, wherein the base layer exhibits a coating thickness of from 50 nm to 8 μm.

8. Cutting tool according to claim 1, wherein the intermediate layer exhibits a coating thickness of from 5 nm to 50 nm.

9. Cutting tool according to claim 1, wherein the functional layer exhibits a coating thickness of from 100 nm to 10 μm.

10. Cutting tool according to claim 1, wherein the functional layer exhibits pressure loadings at the surface of less than 2 GPa.

11. Cutting tool according to claim 1, wherein the base layer consists of titanium-aluminium nitride or titanium-aluminium-silicon nitride.

12. Cutting tool according to claim 1, wherein the intermediate layer contains 0.1 to 5 at. % argon.

13. Cutting tool according to claim 2, wherein the intermediate layer consists of cubic gamma aluminium oxide ($\gamma$-$Al_2O_3$).

14. Cutting tool according to claim 3, wherein the chromium-containing functional layer consists completely of rhombohedral aluminium-chromium oxide $(AlCr)_2O_3$.

15. Cutting tool according to claim 4, wherein the proportion of chromium among metallic elements of the functional layer is at least 85 at. % Cr.

16. Cutting tool according to claim 15, wherein the proportion of chromium among metallic elements of the functional layer is at least 95 at. % Cr.

17. Cutting tool according to claim 7, wherein the coating thickness of the base layer is from 500 nm to 5 μm.

18. Cutting tool according to claim 9, wherein the coating thickness of the functional layer is from 500 nm to 5 μm.

19. Cutting tool according to claim 10, wherein the functional layer exhibits pressure loadings at the surface of less than 1 GPa.

20. Cutting tool according to claim 12, wherein the intermediate layer contains 0.5 to 4 at. % argon.

* * * * *